US007658263B2

(12) United States Patent
Jasnie et al.

(10) Patent No.: US 7,658,263 B2
(45) Date of Patent: Feb. 9, 2010

(54) DEVICE FOR NOISE TRANSMISSION IN A MOTOR VEHICLE

(75) Inventors: Jasris Jasnie, Kalamazoo, MI (US); Keat Mah, Portage, MI (US); Matthias Alex, Heilbronn, DE (US); Sabine Vogt, Benningen, DE (US); Marcus Weber, Ludwigsburg, DE (US)

(73) Assignee: Mann + Hummel GmbH, Ludwigsburg (DE)

( * ) Notice: Subject to any disclaimer, the term of this patent is extended or adjusted under 35 U.S.C. 154(b) by 0 days.

(21) Appl. No.: 12/061,703

(22) Filed: Apr. 3, 2008

(65) Prior Publication Data

US 2009/0250290 A1 Oct. 8, 2009

(51) Int. Cl.
*H05K 5/03* (2006.01)
*F02B 77/13* (2006.01)
*F02M 35/10* (2006.01)

(52) U.S. Cl. .................. 181/204; 181/151; 123/184.57; 123/184.53

(58) Field of Classification Search ................. 181/204, 181/250, 151, 166; 381/391, 347, 354; 123/184.57, 123/184.53, 198 E
See application file for complete search history.

(56) References Cited

U.S. PATENT DOCUMENTS 3,798,393 A * 3/1974 Gorike ....................... 381/372
4,440,983 A * 4/1984 Facoetti et al. .............. 381/190
4,887,690 A * 12/1989 Patel .......................... 181/150
4,953,655 A * 9/1990 Furukawa ................... 181/160
5,113,968 A * 5/1992 Lemmon .................... 181/148
5,400,413 A * 3/1995 Kindel ....................... 381/189
6,551,389 B2 * 4/2003 Spannbauer et al. .......... 96/380
6,600,408 B1 7/2003 Walter et al.
6,644,436 B2 * 11/2003 Hofmann et al. ............ 181/214
6,848,410 B2 * 2/2005 Hoffmann et al. ...... 123/184.57
7,043,045 B2 * 5/2006 Takahashi ................... 381/398
7,188,703 B2 * 3/2007 Hofmann et al. ............ 181/271
7,464,788 B2 * 12/2008 Alex et al. .................. 181/250
2002/0157897 A1 * 10/2002 Hofmann et al. ............ 181/214
2005/0121255 A1 * 6/2005 Hofmann et al. ............ 181/250
2005/0133300 A1 * 6/2005 Hofmann et al. ............ 181/250
2006/0283658 A1 12/2006 Abe et al.
2007/0044747 A1 * 3/2007 Sawatari et al. ........ 123/184.21
2007/0079784 A1 * 4/2007 Sasaki et al. ........... 123/184.53
2007/0277768 A1 * 12/2007 Takeuchi et al. ....... 123/184.57
2009/0000587 A1 * 1/2009 Seko et al. ............. 123/184.57

FOREIGN PATENT DOCUMENTS

DE 4435296 A1 4/1996
DE 19930025 A1 11/2000
DE 10016104 A1 * 10/2001
DE 10116169 A1 10/2002
EP 1748420 A2 * 1/2007
EP 1764779 A2 * 3/2007
JP 57051910 A * 3/1982
JP 2003262166 A * 9/2003
JP 2004218458 A * 8/2004

* cited by examiner

*Primary Examiner*—Edgardo San Martin

(57) ABSTRACT

A device for noise transmission of an intake system of an internal combustion engine to the interior of a motor vehicle has a transmission line having an inlet at a first end and an exit provided with a mouth at a second end. A diaphragm is arranged at the second end to close off the mouth and to enable noise transmission. The inlet of the transmission line communicates with the intake system of the internal combustion engine. A protective device is arranged at the second end to protect the diaphragm.

20 Claims, 2 Drawing Sheets

DEVICE FOR NOISE TRANSMISSION IN A MOTOR VEHICLE

BACKGROUND OF THE INVENTION

The invention relates to a device for noise transmission in a motor vehicle from an intake system of an internal combustion engine to the interior of the motor vehicle, wherein the device comprises a housing that has an inlet arranged at a transmission line and an exit provided with a mouth that is closed off by a diaphragm enabling noise transmission. The transmission line is connected to the intake system of the internal combustion engine.

As a drive unit, modern motor vehicles have internal combustion engines that are running very smoothly so that the operating noise can be hardly heard in the interior of the motor vehicle. The operating noise of the internal combustion engine is sometimes drowned by secondary noises generated by the rolling noise of the wheels, a venting system that is switched on or the like. Under certain circumstances it can be desirable to transmit the operating noise of the internal combustion engine to the interior of the motor vehicle.

U.S. Pat. No. 6,600,408 B1 discloses a device for sound transmission for a motor vehicle. In this device, the sound is transmitted along a pipe conduit and a chamber in which a diaphragm is arranged toward the interior of the motor vehicle. The chamber that surrounds the diaphragm is comprised of several assembled parts.

The publication DE 101 16 169 A1 discloses a resonator chamber in which the diaphragm is arranged.

The patent DE 44 35 296 discloses a diaphragm for noise transmission in a motor vehicle in which the diaphragm is clamped in a holder.

U.S. publication 2006/0283658 A1 discloses a system for noise increase of an intake system of a motor vehicle. Various possibilities of noise introduction into the interior of the motor vehicle are illustrated wherein the diaphragm is arranged in a pipe conduit for noise transmission.

In the publication DE 199 30 025 A1 a sound transmission body is illustrated in which the diaphragm is clamped between two transmission members.

SUMMARY OF THE INVENTION

It is an object of the present invention to provide a device for sound transmission in which the diaphragm is well protected even without being arranged in a housing or in a pipe system.

In accordance with the present invention, this is achieved in that the mouth is provided with a protective device for the diaphragm.

A device for noise transmission is proposed in which a transmission line from an intake system of an internal combustion engine is arranged so as to extend in the direction toward the interior passenger compartment of the motor vehicle. At the mouth of this transmission line a diaphragm is provided that is protected by a protective device from damage from the exterior and the interior. A malfunction of the internal combustion engine can produce for a short period of time an increased inner pressure in the transmission line between the intake system and the diaphragm. Such a malfunction causes an over-expansion of the diaphragm with permanent damage so that the transmission line and thus the intake system are no longer sealed air-tightly relative to the ambient. The diaphragm forms a flexible end of the transmission line wherein the desired frequency is determined by the pipe diameter, the pipe length and the diaphragm diameter. The frequency of the noise is determined by the transmission pipe and the diaphragm diameter. The pretension of the diaphragm has an important effect on the transmission characteristics.

The tension of the diaphragm and thus the transmission characteristics are adjustable by a circumferential rib on the transmission line on which the diaphragm is resting. By a pretension between this circumferential rib and a protective device, the diaphragm can be tightened or tensioned without additional fastening elements in the desired way.

By adjusting the height of this rib, the pretension of the diaphragm and thus of the transmission characteristics of noise transmission can be adjusted in a simple way and without additional expenditure.

The transmission line or the receptacle for the diaphragm can be mounted by means of simple hose clamps or a snap-on connection with holders on the vehicle.

In a preferred embodiment the transmission line, or at least the receptacle for the diaphragm, has rotational symmetry. An expansion of the cross-section of the transmission line in a section immediately upstream of the diaphragm is advantageous. The diaphragm can be arranged at the end of the transmission line or in a separate line section that adjoins the end of the transmission line. The protection of the diaphragm at the end of the transmission line can be realized for example by a simple foam that is arranged upstream of the diaphragm. This foam is acoustically permeable so that an excellent noise transmission is ensured. The shape of the foam is to be matched to the diaphragm and to the space available for installing it. The foam can be glued to the component, clamped thereon or welded thereto. Also, a snap-on connection is conceivable. The foam can be inserted between a cage and the diaphragm when in front of the foam a cage or a protective cap is arranged. Such a cage or protective cap can be attached in many ways to the housing or the transmission line. It is possible to screw on the protective cap or to weld it or to connect it by a snap-on connection on the periphery. Gluing is also an option.

The material of the cage as well as that of the housing and the transmission line can be technical plastics. Suitable are in particular polyamide in non-reinforced or reinforced variants or polypropylene. However, other plastics or other materials are also conceivable.

Many variants are possible for the shape and configuration of the protective cap. In one embodiment, the protective cap is a cage that is comprised of individual ribs that provide a satisfactory protection of the diaphragm and at the same time do not negatively affect the noise emission of the diaphragm. In another embodiment, this protective cap is a wire mesh that is arranged in front of the diaphragm in the form of cage.

DESCRIPTION OF THE PREFERRED EMBODIMENTS

Figure 1:
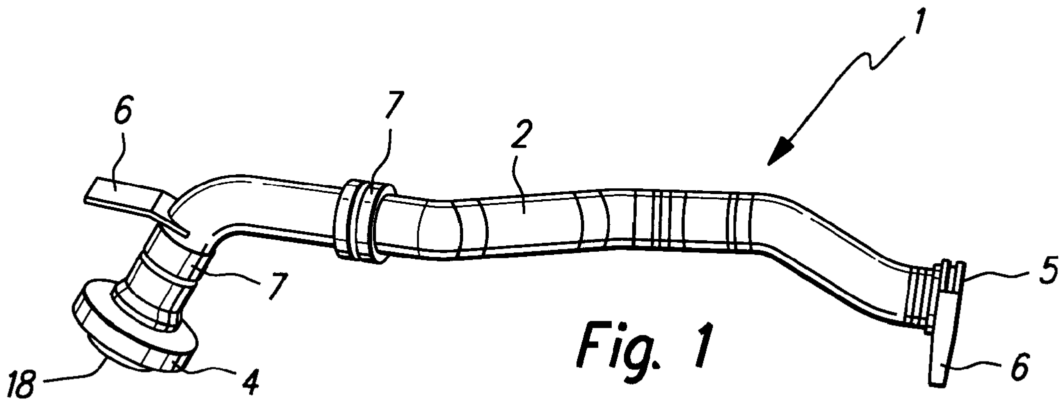
FIG. 1 shows a transmission system with the diaphragm at one end and a connecting flange to the intake system at the other end.

FIG. 1 shows a transmission system 1 for noise transmission on a motor vehicle. The system comprises a flange 5 for connecting it to the intake manifold. Also shown are the transmission line 2 and a mouth 18 with a diaphragm 3 and a protective device 4 arranged in front of the diaphragm. The noise transmission system is attached by holders 6 to the vehicle. The transmission line 2 can be comprised of several parts that are connected to one another by connecting elements 7, as shown in FIG. 1 (e.g. housing 8 and line sections). Moreover, the transmission line 2 can have acoustic features such as resonators. The connecting flange 5 to the intake system is connected to the clean air conduit of the intake manifold of the internal combustion engine. The other end of the transmission line 2 with the mouth 18 is closed off by diaphragm 3 and is protected by the protective device 4. This end is oriented in the direction toward sound-transmitting wall of the interior of a motor vehicle, not illustrated, or is connected directly to the interior. The sound-transmitting wall can be, for example, the partition that delimits the engine compartment relative to the interior of the motor vehicle. The oscillating sound pressure in the intake pipe is transmitted through the transmission line 2 onto the diaphragm 3 that in turn is caused to vibrate. These vibrations are introduced into the interior as a result of the transmission from the diaphragm 3 through the sound pressure-transmitting wall and are thus audible in the interior.

Figure 2:
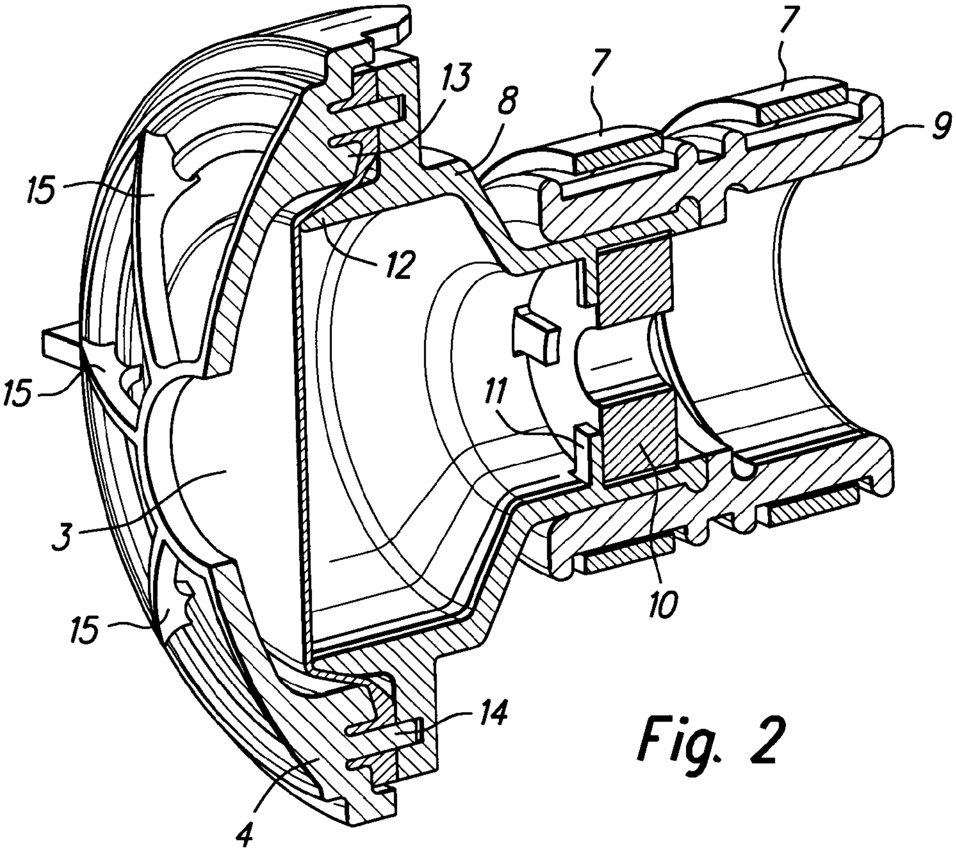
FIG. 2 shows a perspective section view of the end of the transmission line and the diaphragm with a protective cage arranged in front of it.

FIG. 2 shows a perspective illustration of a section view of a housing 8 receiving the diaphragm 3; a protective device 4 is arranged in front of the diaphragm. The housing 8 is connected by connecting member 9 within the transmission line 2 and attached by connecting elements 7. The diaphragm 3 closes off the housing 8 in an air-tight way and is clamped between housing 8 and protective device 4 that is e.g. a protective cap. Throttles 10, as shown in the illustrated embodiment, can be arranged in the interior of the housing 8; they are secured by positioning pins 11 in a certain position. As a result of the oscillating air pressure in the intake pipe and thus in the transmission line 2 the diaphragm 3 is caused to vibrate and emits sound outwardly in the direction toward the passenger compartment. In the context of the present invention, the diaphragm 3 is defined as a thin-walled flat member that is essentially yielding or flexible in a direction transverse to the plane of its extension. Depending on the application, for obtaining the corresponding mechanical properties the diaphragm 3 can be made of rubber film, fabric or plastic film or can also be a metal foil or a thin sheet metal. In a preferred embodiment, the diaphragm 3 is comprised of a rubber material, for example, ethylene propylene diene rubber (EPDM), silicon rubber (VMQ), fluorosilicone rubber (FVMQ), fluoropolymer rubber (FPM or FKM) or other diaphragm materials that are employed in the field of internal combustion engines and known to a person skilled in the art. The diaphragm 3 is tightened across a circumferential rim 12 and thus seals the housing 8 in a pressure-tight way relative to the ambient. The diaphragm 3 is attached and tightened by placing the protective cap 4 onto the diaphragm 3 placed on the rim 12; the cap 4 has a matching circumferential edge 13. The height of the circumferential rim 12 determines the tension of the diaphragm 3 and thus the acoustic behavior of the device for noise transmission. The height of the rounded rim 12 can be adjusted simply by means of the mold of the housing 8. The housing 3 for receiving the diaphragm can be made, for example, of plastic material by an injection molding process. Suitable as technical plastics, polyamide that can be reinforced or non-reinforced or polypropylene are particularly suitable. The diaphragm 3 is secured on the outer side between housing 8 and the protective cap 4 by clamping forces. The securing action can be assisted by a positive locking action in that, for example, pins 14 of the protective cap 4 pass through the diaphragm and engage the housing 8. The protective device 4 can be connected for example by a snap-on connection to the housing 8. Moreover, it is also conceivable to weld or screw-connect the protective device 4 to the housing.

The protective cap 4 must be acoustically permeable or transmissive and has the task to protect the diaphragm 3. When, as a result of a malfunction of the internal combustion engine a great pressure increase in the transmission line 2 occurs, the diaphragm 3 bulges outwardly. The protective device 4 is provided to prevent that the diaphragm 3 will overexpand (overstretch) or rupture. For this purpose, in particular a protective grid 4 with ribs is provided against which the diaphragm 3 will rest in case of overpressure. Between the protective ribs 15 there are free segments that enable sound transmission to the exterior. This protective grid 4 is manufactured preferably as an injection-molded plastic part. The plastic material is to be selected in particular from technical plastics such as polyamide, PA6 and PA66, suitable for use in the engine compartment.

In another embodiment, this protective device 4 can also be comprised of a wiremesh that enables a uniform contact of the diaphragm 3 in the case of overpressure. This mesh can be inserted and/or embedded by injection-molding in a plastic ring that connects the protective device to the housing 8.

The diaphragm 3 can be attached directly to the transmission line 2 or to a housing 8 that is part of the transmission line 2. The connection of the housing 8 to the transmission line 2 is provided by a connecting member 9 that compensates tolerances between the components to be connected and provides a seal-tight connection. The connecting member 9 is attached by means of connecting elements 7 such as hose clamps or other clamps or brackets.

Figure 3:
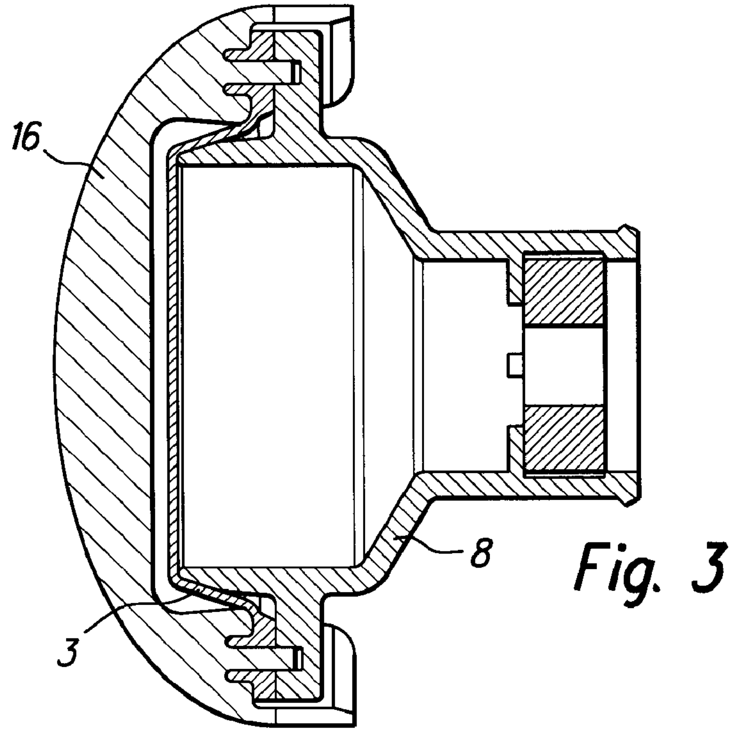
FIG. 3 shows the end of the transmission line with diaphragm and a foam material arranged in front of it.

FIG. 3 shows a section of housing 8 with the protective device 4 made of foam 16. In this embodiment, the diaphragm 3 is protected by an acoustically permeable foam 16 that is arranged in front of the diaphragm 3. This foam 16 can either rest immediately against the diaphragm 3 or can be positioned at a spacing therefrom. The diaphragm 3 in the case of overpressure will contact/rest against the foam 16 so that in this way rupture of the diaphragm 3 or over expansion is prevented. The foam 16 can be attached to rim 12 circumferentially surrounding the housing 8, for example, by gluing or welding.

Figure 4:
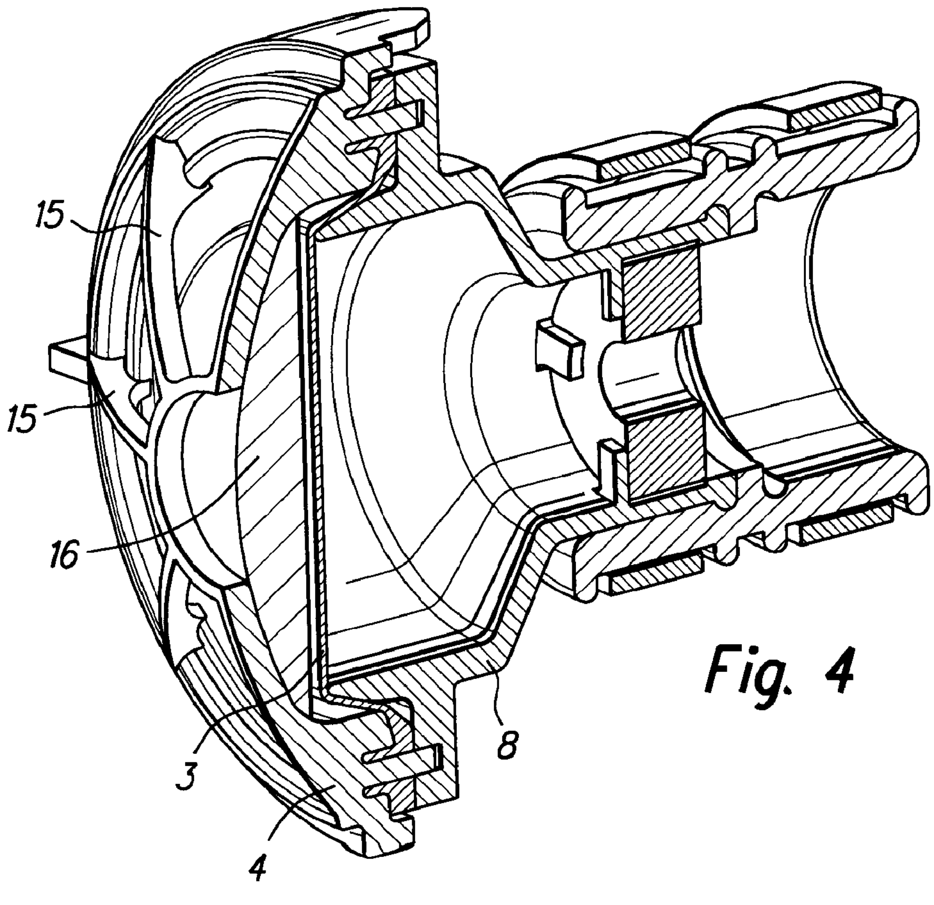
FIG. 4 shows a perspective illustration of a section of the end of the transmission line with diaphragm and with a protective grid arranged about the foam.

FIG. 4 shows a perspective illustration of a section of a housing 8 of a transmission line 2 with a tightened diaphragm 3 and a foam 16 arranged in front of it. The foam 16 is attached by a protective grid 4 that, in turn, is secured to the housing 8. In this embodiment, the housing 8 with foam 16, as described FIG. 3, is combined with a protective grid 4 as described in FIG. 2. The foam 16 can be inserted between the protective grid 4 and the diaphragm 3. The protective grid 4 comprised of a grid structure of ribs 15 or a metal grid is connected peripherally to the housing 8. The foam 16 is inserted between the protective grid 4 and the diaphragm 3 and must not be attached separately. In this embodiment, the diaphragm 3 is protected from an inner pressure that is too great within the transmission line 2 but also protected from effects coming from the exterior, such as soiling, because in the area of the free segments of the protective grid 4 the foam 16 protects and completely covers the diaphragm 3.

While specific embodiments of the invention have been shown and described in detail to illustrate the inventive principles, it will be understood that the invention may be embodied otherwise without departing from such principles.

What is claimed is:

1. A device for noise transmission of an intake system of an internal combustion engine to the interior of a motor vehicle, the device comprising:

a transmission line having a first end and a second end, wherein the first end has an inlet and the second end has an exit comprised of a mouth;

a diaphragm that is arranged at the second end to close off the mouth and that enables noise transmission;

wherein the inlet of the transmission line communicates with the intake system of the internal combustion engine;

an acoustically permeable protective device arranged at the second end shaped and positioned to limit extension of said diaphragm during short period of time pressure increases within said transmission line.

2. The device according to claim 1, wherein the mouth is arranged immediately in front of a partition of a motor vehicle which partition separates the interior from a motor compartment of the motor vehicle.

3. The device according to claim 1, wherein the mouth is arranged on a side of a partition, separating the interior from a motor compartment of the motor vehicle, which side of the partition faces the interior of the motor vehicle.

4. The device according to claim 1, wherein the protective device is comprised of a foam that s acoustically permeable and is arranged in front of the mouth.

5. The device according to claim 1, wherein the protective device is comprised of protective grid arranged in front of the mouth.

6. The device according to claim 1, wherein the diaphragm is clamped between a circumferential rim at the second end of the transmission line and a circumferential edge of the protective device.

7. The device according to claim 6, wherein a tension of the diaphragm is adjustable by a height of the circumferential rim.

8. The device according to claim 1, wherein the protective device is comprised of a wiremesh.

9. The device according to claim 1, wherein the protective device is an injection-molded part and has several ribs.

10. The device according to claim 1, further comprising an acoustically permeable foam that is arranged between the protective device and the diaphragm.

11. The device according to claim 1, wherein said transmission line includes a housing at said second end, said housing forming said mouth; and said acoustically permeable protective device is a domed protective cage, said cage positioned and having a shape configured to provide support upon which said diaphragm rests during said pressure increases, said protective cage secured to said mouth.

12. The device according to claim 11, wherein said protective cage comprises any of: a ribbed grid, a supportive foam or a wire mesh.

13. The device according to claim 11, further comprising acoustically permeable foam positioned between said diaphragm and said protective cage, said foam positioned and configured to cushion and support said diaphragm during said pressure increases.

14. The device according to claim 11, wherein said diaphragm is clamped between a circumferential rim at said mouth of said housing and a circumferential edge of said protective device; and wherein a height of said circumferential rim is selected to obtain a desired acoustic behavior of said device.

15. The device according to claim 11, wherein said housing further comprises:

at least one throttle arranged in the interior of said housing upstream of said diaphragm; and at least one positioning pin formed within said housing and configured to secure said throttle in a predetermined position.

16. A device for noise transmission of an intake system of an internal combustion engine to the interior of a motor vehicle, the device comprising:

a transmission line having a first end and a second end, wherein the first end has an inlet in air pressure communication with said intake system of said internal combustion engine and the second end has an exit including a mouth;

a flexible diaphragm extending over and closing off said mouth in an air-tight way, said diaphragm flexible in a direction transverse to a plane of its extension and operable to transmit pressure fluctuations within said intake system towards said motor vehicle interior as sound;

a domed protective cage arranged over said diaphragm at said mouth, said cage positioned and cooperatively shaped to provide support upon which said diaphragm rests during occurrences of elevated pressure within said transmission line;

wherein said mouth has a circumferential rim over which said diaphragm is clamped; and wherein a transmission sound characteristic of said diaphragm is adjusted by selecting a height of said circumferential rim.

17. A method of preventing over expansion of a diaphragm in an engine sound transmission device comprising:

providing a sound transmission line having a first end in communication with an air intake system of an internal combustion engine;

providing a flexible sound transmission diaphragm closing over a second end of said sound transmission line, wherein said diaphragm is flexibly extensible in response to air pressure fluctuations within said intake system; and providing a protective cage having a shape selected such that said diaphragm is operable to supportively contact and rest against said cage during elevated pressure conditions in said intake system.

18. The method of claim 17 further comprising:

adjusting sound transmission characteristics of said device by selecting a height of a circumferential rim of said second end over which said diaphragm is arranged to calibrate a desired diaphragm pretension; and clamping said protective cage onto said second end to establish said desired pretension.

19. The method of claim 18 further comprising:

positioning a layer of acoustically permeable foam between said diaphragm and said cage to further protect said diaphragm.

20. The method of claim 17, wherein the providing a protective cage step, said cage comprises any of: a ribbed grid, a supportive foam or a wire mesh.

* * * * *